United States Patent
Song et al.

(10) Patent No.: US 12,527,013 B2
(45) Date of Patent: *Jan. 13, 2026

(54) CAPACITOR, SEMICONDUCTOR DEVICE INCLUDING THE SAME, AND METHOD OF FABRICATING CAPACITOR

(71) Applicant: Samsung Electronics Co., Ltd., Suwon-si (KR)

(72) Inventors: Jeonggyu Song, Seongnam-si (KR); Younsoo Kim, Yongin-si (KR); Jaeho Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/626,726

(22) Filed: Apr. 4, 2024

(65) Prior Publication Data

US 2024/0274650 A1    Aug. 15, 2024

Related U.S. Application Data

(60) Continuation of application No. 18/170,977, filed on Feb. 17, 2023, which is a division of application No. (Continued)

(30) Foreign Application Priority Data

Feb. 26, 2020  (KR) .................. 10-2020-0023706

(51) Int. Cl.
    *H10B 12/00*    (2023.01)
    *H10D 1/68*    (2025.01)

(52) U.S. Cl.
    CPC .............. *H10D 1/68* (2025.01); *H10B 12/31* (2023.02); *H10D 1/696* (2025.01)

(58) Field of Classification Search
    CPC ........... H10D 1/68; H10D 1/696; H10B 12/31
    See application file for complete search history.

(56) References Cited

U.S. PATENT DOCUMENTS 7,416,936 B2    8/2008  Kil et al.
7,554,161 B2    6/2009  Ahn et al.
(Continued)

FOREIGN PATENT DOCUMENTS

CN    102446890 A    5/2012
CN    110718538 A    1/2020
(Continued)

OTHER PUBLICATIONS

Extended European Search Report dated Jul. 20, 2021, issued in corresponding European Patent Application No. 21155950.5.
(Continued)

*Primary Examiner* — Mohammad M Choudhry
(74) *Attorney, Agent, or Firm* — HARNESS, DICKEY & PIERCE, P.L.C.

(57) ABSTRACT

A capacitor includes: a bottom electrode; a top electrode over the bottom electrode; a dielectric film between the bottom electrode and the top electrode; and a doped $Al_2O_3$ film between the top electrode and the dielectric film, wherein the doped $Al_2O_3$ film includes a first dopant, and an oxide including the same element as the first dopant has a higher dielectric constant than a dielectric constant of $Al_2O_3$.

20 Claims, 20 Drawing Sheets

Related U.S. Application Data

17/060,911, filed on Oct. 1, 2020, now Pat. No. 11,594,592.

(56) References Cited

U.S. PATENT DOCUMENTS

| | | |
|---|---|---|
| 7,974,073 B2 | 7/2011 | Takemura et al. |
| 8,288,241 B2 | 10/2012 | Hirota et al. |
| 2002/0140011 A1 | 10/2002 | Zhang et al. |
| 2003/0072126 A1 | 4/2003 | Bhattacharyya |
| 2003/0089942 A1 | 5/2003 | Bhattacharyya |
| 2003/0168750 A1 | 9/2003 | Basceri et al. |
| 2004/0235242 A1 | 11/2004 | Basceri et al. |
| 2005/0110115 A1 | 5/2005 | Kil et al. |
| 2005/0224913 A1 | 10/2005 | Bhat et al. |
| 2006/0006497 A1 | 1/2006 | Ahn et al. |
| 2006/0040457 A1 | 2/2006 | Lee et al. |
| 2007/0066012 A1 | 3/2007 | Ohtsuka et al. |
| 2008/0118731 A1 | 5/2008 | Srinivasan et al. |
| 2013/0052790 A1 | 2/2013 | Deweerd et al. |
| 2019/0333985 A1 | 10/2019 | Lee et al. |
| 2020/0020780 A1 | 1/2020 | Kim |
| 2021/0118982 A1 | 4/2021 | Song et al. |
| 2022/0271143 A1 | 8/2022 | Kim |

FOREIGN PATENT DOCUMENTS

| | | | |
|---|---|---|---|
| JP | 2003/17581 A | 1/2003 | |
| JP | 2003/229425 A | 8/2003 | |
| JP | 2005/159271 A | 6/2005 | |
| JP | 2007/081265 A | 3/2007 | |
| JP | 5013662 B2 | 8/2012 | |
| JP | 2013/151722 A | 8/2013 | |
| KR | 2001/0028836 A | 4/2001 | |
| KR | 2005/0007592 A | 1/2005 | |
| KR | 100716642 B1 | 5/2007 | |
| KR | 2009/0074258 A | 7/2009 | |
| KR | 100945877 B1 | 3/2010 | |
| KR | 2010/0078264 A | 7/2010 | |
| KR | 2021/0047119 A | 4/2021 | |

OTHER PUBLICATIONS

Kristin Persson, "Materials Data on Au2O3 (SG:43) by Materials Project" Materials Project, Nov. 2014.

Japanese Office Action dated Jul. 4, 2022, issued in corresponding Japanese Patent Application No. 2021-030321.

Chinese Office Action dated Jul. 5, 2023, issued in corresponding Chinese Patent Application No. 202011020909.5.

Office Action dated Oct. 6, 2023, issued in corresponding U.S. Appl. No. 18/175,095.

Office Action dated Oct. 10, 2023, issued in corresponding U.S. Appl. No. 18/170,977.

Notice of Allowance dated Jan. 4, 2024, issued in corresponding U.S. Appl. No. 18/170,977.

Notice of Allowance dated Mar. 21, 2024, issued in corresponding U.S. Appl. No. 18/175,095.

A. Berthelot et al., Highly Reliable TiN/ZrO2/TiN 3D Stacked Capacitors for 45 nm Embedded DRAM Technologies, 2006 European Solid-State Device Research Conference (2006): 343-346.

Chen-Han Chou et al., "Low-Leakage Tetragonal ZrO2 (EOT < 1 nm) With In Situ Plasma Interfacial Passivation on Germanium", IEEE Electron Device Letters, 37(2), 138-141. (2016).

CAPACITOR, SEMICONDUCTOR DEVICE INCLUDING THE SAME, AND METHOD OF FABRICATING CAPACITOR

CROSS-REFERENCE TO RELATED APPLICATION

This application is a continuation of U.S. application Ser. No. 18/170,977, filed Feb. 17, 2023, which is a divisional of U.S. application Ser. No. 17/060,911 (now U.S. Pat. No. 11,594,592), filed Oct. 1, 2020, which claims the benefit of Korean Patent Application No. 10-2020-0023706, filed on Feb. 26, 2020, in the Korean Intellectual Property Office, the disclosure of each of which is incorporated herein in its entirety by reference.

BACKGROUND

1. Field

The present disclosure relates to capacitors, semiconductor devices, and methods of fabricating capacitors.

2. Description of Related Art

Along with down-scaling of integrated circuit devices, spaces occupied by capacitors have been reduced. Capacitors include top and bottom electrodes and dielectric films between these electrodes and employ dielectric materials having high dielectric constants to exhibit high capacitance. Leakage current may flow through the insides of capacitors. Techniques for reducing and/or minimizing a reduction in capacitance while reducing leakage current flowing through the insides of capacitors may be needed.

SUMMARY

Provided are capacitors having excellent leakage current blocking properties and having high capacitance.

Provided are semiconductor devices which include capacitors having excellent leakage current blocking properties and having high capacitance.

Provided are methods of fabricating capacitors which have excellent leakage current blocking properties and have high capacitance.

However, the present disclosure is not limited to the aspects set forth above.

Additional aspects will be set forth in part in the description which follows and, in part, will be apparent from the description, or may be learned by practice of the presented embodiments of the disclosure.

According to an aspect of an embodiment, a capacitor includes: a bottom electrode; a top electrode over the bottom electrode; a dielectric film between the bottom electrode and the top electrode; and a doped $Al_2O_3$ film between the top electrode and the dielectric film. The doped $Al_2O_3$ film includes a first dopant, and an oxide including a same element as the first dopant has a higher dielectric constant than a dielectric constant of $Al_2O_3$.

In some embodiments, the first dopant may include one of Ca, Sr, Ba, Sc, Y, La, Ti, Hf, Zr, Nb, Ta, Ce, Pr, Nd, Gd, Dy, Yb, and Lu.

In some embodiments, the doped $Al_2O_3$ film may include the first dopant in an amount greater than 0% and less than 50 at %.

In some embodiments, the doped $Al_2O_3$ film may further include a second dopant that is different from the first dopant, and an oxide including a same element as the second dopant may have a higher dielectric constant than the dielectric constant of $Al_2O_3$.

In some embodiments, the second dopant may include one of Ca, Sr, Ba, Sc, Y, La, Ti, Hf, Zr, Nb, Ta, Ce, Pr, Nd, Gd, Dy, Yb, and Lu.

In some embodiments, the first dopant and the second dopant may be present in an amount greater than 0 at % and less than 50 at % in total in the doped $Al_2O_3$ film.

In some embodiments, the bottom electrode may directly contact the dielectric film.

In some embodiments, the capacitor may further include an interfacial film between the bottom electrode and the dielectric film, and the interfacial film may include an oxide including a metal element that is included in the bottom electrode.

In some embodiments, the bottom electrode may include a metal nitride represented by MM'N, and the interfacial film may include a metal oxynitride represented by MM'ON, wherein M may be a metal element, M' may be an element different from M, N may be nitrogen, and O may be oxygen.

In some embodiments, the bottom electrode may include carbon impurities in an amount greater than 0% and less than or equal to 1%.

In some embodiments, M may be Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, or U.

In some embodiments, M' may be H, Li, Be, B, N, O, Na, Mg, Al, Si, P, S, K, Ca, Sc, Ti, V, Cr, Mn, Fe, Co, Ni, Cu, Zn, Ga, Ge, As, Se, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, or U.

In some embodiments, the metal nitride may be represented by $M_xM'_yN_z$ where $0<x\leq2$, $0<y\leq2$, and $0<z\leq4$ may be satisfied.

In some embodiments, the dielectric film may have a thickness of greater than 0 nm and less than 5 nanometers (nm), and the doped $Al_2O_3$ film may have a thickness of greater than 0 nm and less than 2 nm.

In some embodiments, the top electrode may directly contact a top surface of the doped $Al_2O_3$ film, and the dielectric film may directly contact a bottom surface of the doped $Al_2O_3$ film.

In some embodiments, the top electrode may include TiN, MON, CON, TaN, TiAlN, TaAlN, W, Ru, $RuO_2$, $SrRuO_3$, Ir, $IrO_2$, Pt, PtO, (Ba, Sr)$RuO_3$ (BSRO), $CaRuO_3$ (CRO), (La, Sr)$CoO_3$ (LSCO), or a combination thereof.

According to an aspect of another embodiment, a semiconductor device includes: a substrate; a gate structure on the substrate; a first source/drain region and a second source/drain region, both arranged in upper portions of the substrate; and a capacitor on the substrate. The capacitor includes a bottom electrode, a top electrode, a dielectric film between the bottom electrode and the top electrode, and a doped Al2O3 film between the top electrode and the dielectric film. The bottom electrode is electrically connected to the first source/drain region. The top electrode is over the bottom electrode. The doped $Al_2O_3$ film includes a first dopant. An oxide including a same element as the first dopant has a higher dielectric constant than a dielectric constant of $Al_2O_3$.

In some embodiments, the doped $Al_2O_3$ film may further include a second dopant that is different from the first dopant. An oxide including a same element as the second dopant may have a higher dielectric constant than the dielectric constant of $Al_2O_3$.

In some embodiments, the first dopant and the second dopant may be selected from different elements among Ca, Sr, Ba, Sc, Y, La, Ti, Hf, Zr, Nb, Ta, Ce, Pr, Nd, Gd, Dy, Yb, and Lu.

In some embodiments, the doped $Al_2O_3$ film may include the first dopant and the second dopant in an amount greater than 0 at % and less than 50 at % in total.

In some embodiments, the bottom electrode may include a metal nitride represented by MM'N, wherein M may be a metal element, M' may be an element different from M, N may be nitrogen, and O may be oxygen.

In some embodiments, M may be Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, or U. M' may be H, Li, Be, B, N, O, Na, Mg, Al, Si, P, S, K, Ca, Sc, Ti, V, Cr, Mn, Fe, Co, Ni, Cu, Zn, Ga, Ge, As, Se, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, or U.

In some embodiments, the metal nitride may be represented by MxM'yNz, where $0<x\le2$, $0<y\le2$, and $0<z\le4$ may be satisfied.

In some embodiments, the top electrode may directly contact a top surface of the doped $Al_2O_3$ film, and the dielectric film may directly contact a bottom surface of the doped $Al_2O_3$ film.

According to another embodiment, a method of fabricating a capacitor includes: forming a bottom electrode; forming a dielectric film on the bottom electrode; forming a doped $Al_2O_3$ film on the dielectric film; and forming a top electrode on the doped $Al_2O_3$ film. The doped $Al_2O_3$ film includes a first dopant. An oxide including a same element as the first dopant has a higher dielectric constant than a dielectric constant of $Al_2O_3$.

In some embodiments, the forming the doped $Al_2O_3$ film may include forming an $Al_2O_3$ film on the dielectric film and performing a heat treatment on the dielectric film and the $Al_2O_3$ film. The dielectric film may include an oxide of an element that is the same as the first dopant. The performing the heat treatment may include diffusing the element that is the same as the first dopant from the dielectric film into the $Al_2O_3$ film by the heat treatment to provide the doped $Al_2O_3$ film by the heat treatment to provide the doped $Al_2O_3$ film. The first dopant may be Ca, Sr, Ba, Sc, Y, La, Ti, Hf, Zr, Nb, Ta, Ce, Pr, Nd, Gd, Dy, Yb, or Lu.

In some embodiments, the forming the doped $Al_2O_3$ film may include: depositing Al, O, and a same element as the first dopant on the dielectric film by an in-situ process, wherein the same element as the first dopant may be Ca, Sr, Ba, Sc, Y, La, Ti, Hf, Zr, Nb, Ta, Ce, Pr, Nd, Gd, Dy, Yb, or Lu.

In some embodiments, the doped $Al_2O_3$ film may further include a second dopant that is different from the first dopant, and an oxide including a same element as the second dopant may have a higher dielectric constant than the dielectric constant of $Al_2O_3$.

In some embodiments, the forming the doped $Al_2O_3$ film may include: forming an additional oxide film on the dielectric film; forming an $Al_2O_3$ film on the additional oxide film, performing a heat treatment. The heat treatment may be performed on the dielectric film, the additional oxide film, and the $Al_2O_3$ film. The dielectric film and the additional oxide film may respectively include oxides including two different elements selected from among Ca, Sr, Ba, Sc, Y, La, Ti, Hf, Zr, Nb, Ta, Ce, Pr, Nd, Gd, Dy, Yb, and Lu. The two elements, which are selected from among Ca, Sr, Ba, Sc, Y, La, Ti, Hf, Zr, Nb, Ta, Ce, Pr, Nd, Gd, Dy, Yb, and Lu and are respectively in the dielectric film and the additional oxide, may be diffused into the $Al_2O_3$ film by the heat treatment. The first dopant and the second dopant may be respectively the two elements selected from among Ca, Sr, Ba, Sc, Y, La, Ti, Hf, Zr, Nb, Ta, Ce, Pr, Nd, Gd, Dy, Yb, and Lu and diffused into the $Al_2O_3$ film.

In some embodiments, the doped $Al_2O_3$ film may include the first dopant and the second dopant in an amount greater than 0 at % and less than 50 at % in total.

In some embodiments, the forming the bottom electrode may include: arranging a substrate in a reaction chamber; supplying a first source including a metal organic ligand into the reaction chamber; performing a first purging for removing an organic ligand of the first source that is not adsorbed onto the substrate; supplying a second source including a halogen compound into the reaction chamber; performing second purging for removing the organic ligand that has not reacting with the second source; and supplying a nitridant into the reaction chamber.

In some embodiments, the metal organic ligand may be represented by $MR_x$ (where M may be a metal element, M, and R may be an organic ligand), wherein x may be in a range of $0<x\le6$.

In some embodiments, M may be Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, or U.

In some embodiments, R may include at least one of a C1-C10 alkyl group, a C2-C10 alkenyl group, a carbonyl group (C=O), a halide, a C6-C10 aryl group, a C6-C10 cycloalkyl group, a C6-C10 cycloalkenyl group, (C=O)R (where R is hydrogen or a C1-C10 alkyl group), a C1-C10 alkoxy group, a C1-C10 amidinate, a C1-C10 alkylamide, a C1-C10 alkylimide, —N(Q)(Q') (where Q and Q' are each independently a C1-C10 alkyl group or hydrogen), Q(C=O)CN (where Q is hydrogen or a C1-C10 alkyl group), and a C1-C10 β-diketonate.

In some embodiments, halogen compound may be represented by $M'A_y$ (where y is a real number greater than 0 and A may be a halogen element. M' may be H, Li, Be, B, N, O, Na, Mg, Al, Si, P, S, K, Ca, Sc, Ti, V, Cr, Mn, Fe, Co, Ni, Cu, Zn, Ga, Ge, As, Se, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, or U.

In some embodiments, A may include at least one of F, Cl, Br, and I, and y may be in a range of $0<y\le6$.

In some embodiments, the supplying the first source, the supplying the second source, and the supplying the nitridant may be performed using an atomic layer deposition (ALD) process.

In some embodiments, the nitridant may include at least one of $NH_3$, $N_2H_2$, $N_3H$, and $N_2H_4$.

In some embodiments, the method set forth above may further include performing a heat treatment for removing the halogen element of the halogen compound, the halogen element remaining as a reaction by-product.

In some embodiments, the bottom electrode may include carbon impurities in an amount greater than 0% and less than or equal to 1%.

According to an embodiment, a capacitor includes a bottom electrode; a top electrode over the bottom electrode; a dielectric film between the bottom electrode and the top electrode; and a doped $Al_2O_3$ film between the top electrode and the dielectric film. The doped $Al_2O_3$ film may include a first dopant. An oxide of first dopant may have a dielectric constant that is higher than a dielectric constant of $Al_2O_3$.

In some embodiments, the doped $Al_2O_3$ film may further include a second dopant that is different from the first dopant. An oxide of second dopant may have a dielectric constant that is higher than a dielectric constant of $Al_2O_3$. The first dopant and the second dopant may be different elements among Ca, Sr, Ba, Sc, Y, La, Ti, Hf, Zr, Nb, Ta, Ce, Pr, Nd, Gd, Dy, Yb, or Lu. The dielectric film may include an oxide of the first dopant, an oxide of the second dopant, or both the oxide of the first dopant and the oxide of the second dopant.

In some embodiments, the dielectric film may include a first region and a second region. The first region may include the oxide of the first dopant. The second region may include the oxide of the second dopant. The second region of the dielectric film may be between the first region of the dielectric film and the doped $Al_2O_3$ film.

In some embodiments, a semiconductor device may include one of the above-described capacitors.

In some embodiments, a semiconductor device may include one of the above-described capacitors.

BRIEF DESCRIPTION OF THE DRAWINGS

The above and other aspects, features, and effects of certain embodiments of the disclosure will be more apparent from the following description taken in conjunction with the accompanying drawings, in which.

DETAILED DESCRIPTION

Figure 1:
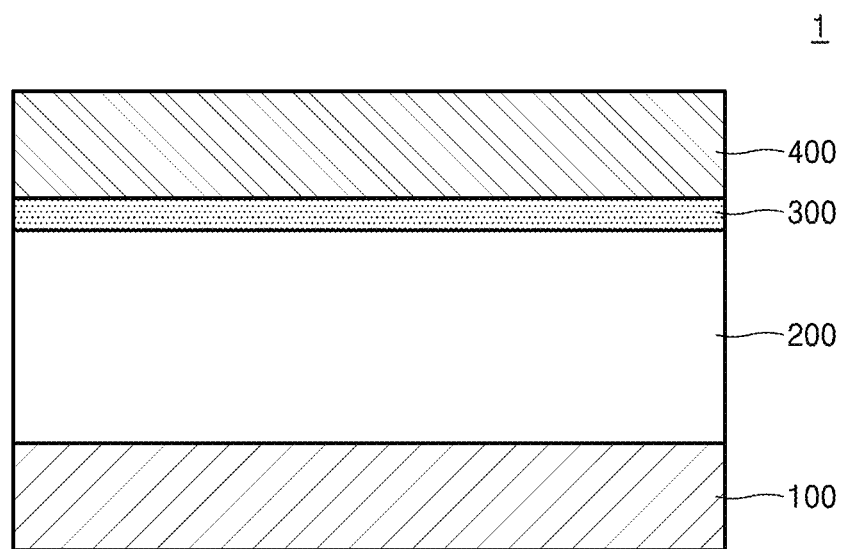
FIG. 1 is a cross-sectional view of a capacitor according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

Hereinafter, embodiments of the present disclosure will be described in detail with reference to the accompanying drawings. Like components will be denoted by like reference numerals throughout the specification, and in the drawings, the size of each component may be exaggerated for clarity and convenience of descriptions. It should be understood that embodiments described below are provided for illustrative purposes only and that various changes and modifications can be made to these embodiments.

It will be understood that, when an element is referred to as being placed "on" another element, it can be directly placed on the other element, or an intervening layer(s) may also be present.

As used herein, the singular terms "a," "an" and "the" are intended to include the plural forms as well, unless the context clearly indicates otherwise. It will be understood that the terms such as "comprises", "comprising", "includes", "including", "has", and "having", when used herein, specify the presence of stated components, but do not preclude the presence or addition of other components, unless clearly stated otherwise.

As used herein, the terms "part," "module," and the like refers to a unit for performing at least one function or operation, and such a the unit may be implemented by hardware, software, or a combination of hardware and software.

FIG. 1 is a cross-sectional view of a capacitor according to an example embodiment.

Referring to FIG. 1, a capacitor 1 may be provided. The capacitor 1 may include a bottom electrode 100, a dielectric film 200, a doped $Al_2O_3$ film 300, and a top electrode 400. A material of the bottom electrode 100 may be selected to secure conductivity for use as an electrode and to maintain stable capacitance performance even after a high temperature process during a process of fabricating the capacitor 1.

In an example, the bottom electrode 100 may include a metal, a metal nitride, a metal oxide, or a combination thereof. For example, the top electrode 400 may include TiN, MON, CON, TaN, W, Ru, RuO$_2$, SrRuO$_3$, Ir, IrO$_2$, Pt, PtO, (Ba, Sr)RuO$_3$ (BSRO), CaRuO$_3$ (CRO), (La,Sr)CoO$_3$ (LSCO), or a combination thereof.

For example, the bottom electrode 100 may include a metal nitride represented by MM'N. Here, M is a metal element, M' is an element that is different from M, and N is nitrogen. The metal nitride, that is, MM'N, which constitutes the bottom electrode 100, may also be described as being obtained by doping a metal nitride, MN, with an element, M'. M', which is an element different from M, may be a metal, but is not limited thereto, and may be a material other than a metal.

M may be one of Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U.

M' may be one of H, Li, Be, B, N, O, Na, Mg, Al, Si, P, S, K, Ca, Sc, Ti, V, Cr, Mn, Fe, Co, Ni, Cu, Zn, Ga, Ge, As, Se, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U. When a composition ratio of M to M' to N in the metal nitride, MM'N, is x:y:z (e.g., the metal nitride may be M$_x$M$_y$N$_z$), 0<x≤2, 0<y≤2, and 0<z$4 may be satisfied. Electrical properties as well as electrical conductivity of the capacitor 1 may vary depending upon the composition ratio. The composition ratio is a factor that also influences a material composition of an interfacial film 500 (see FIG. 4), and this is because the interfacial film 500 is a main cause of a change in capacitance according to bias voltages. The composition ratio may vary according to specific selections of M and M'.

In an atomic layer deposition (ALD) process generally used to manufacture a metal nitride, as a source of a metal material, a metal organic ligand material is used as a precursor. Here, when an organic ligand is not sufficiently removed after the metal material is applied onto a target surface, carbon impurities are included in a metal nitride film, and this may be a cause of deterioration in performance of a capacitor. In the capacitor 1 according to an embodiment, as described above, the metal nitride, MM'N, is used as a material of the bottom electrode 100, and according to a manufacturing method described below, the metal nitride, MM'N, having almost no carbon impurities is employed for the bottom electrode 100. The bottom electrode 100 may include carbon in an amount of 1% or less and greater than 0%.

The dielectric film 200 may be arranged on the bottom electrode 100. The dielectric film 200 may directly contact the bottom electrode 100. The dielectric film 200 may include a material capable of implementing desired capacitance. Along with increasing degrees of integration of integrated circuit devices including the capacitor 1, a space occupied by the capacitor 1 gradually decreases, and thus, a dielectric having a high dielectric constant may be used. The dielectric film 200 may include a high-dielectric constant (high-k) material. A high dielectric constant denotes a dielectric constant that is higher than the dielectric constant of silicon oxide. The dielectric film 200 may include a metal oxide including at least one metal selected from among Ca, Sr, Ba, Sc, Y, Ti, Hf, Zr, Nb, Ta, Ce, Pr, Nd, Gd, Dy, Yb, and Lu. For example, the dielectric film 200 may include HfO$_2$, ZrO$_2$, CeO$_2$, La$_2$O$_3$, Ta$_2$O$_3$, or TiO$_2$. Although the dielectric film 200 may have a single-layer structure as illustrated, the dielectric film 200 is not limited thereto and may have a multilayer structure. The dielectric film 200 may have a thickness allowing desired capacitance to be implemented. For example, the dielectric film 200 may have a thickness less than 5 nm.

The doped Al$_2$O$_3$ film 300 may be arranged on the dielectric film 200. The doped Al$_2$O$_3$ film 300 may block or reduce flow of leakage current between the top electrode 400 and the bottom electrode 100. That is, the doped Al$_2$O$_3$ film 300 may be a leakage current reducing layer. In an example, the doped Al$_2$O$_3$ film 300 may include a first dopant. The first dopant may be determined such that a dielectric constant of an oxide including the same element as the first dopant is higher than the dielectric constant of Al$_2$O$_3$. For example, the first dopant may be one selected from among Ca, Sr, Ba, Sc, Y, La, Ti, Hf, Zr, Nb, Ta, Ce, Pr, Nd, Gd, Dy, Yb, and Lu. The doped Al$_2$O$_3$ film 300 may include the first dopant in an amount less than 50 at %. In an example, the doped Al$_2$O$_3$ film 300 may further include a second dopant that is different from the first dopant. The second dopant may be determined such that a dielectric constant of an oxide including the same element as the second dopant is higher than the dielectric constant of Al$_2$O$_3$. For example, the second dopant may be one selected from among Ca, Sr, Ba, Sc, Y, La, Ti, Hf, Zr, Nb, Ta, Ce, Pr, Nd, Gd, Dy, Yb, and Lu. In the doped Al$_2$O$_3$ film 300, the first dopant and the second dopant may be present in an amount less than 50 at % in total. The doped Al$_2$O$_3$ film 300 is not limited to including, as a dopant, only one type of element or two types of elements. In another example, the doped Al$_2$O$_3$ film 300 may further include at least one type of dopant that is different from the first and second dopants. For example, the doped Al$_2$O$_3$ film 300 may have a thickness less than 2 nm.

The top electrode 400 may be arranged on the doped Al$_2$O$_3$ film 300. The top electrode 400 may include a metal, a metal nitride, a metal oxide, or a combination thereof. For example, the top electrode 400 may include TiN, MON, CON, TaN, TiAlN, TaAlN, W, Ru, RuO$_2$, SrRuO$_3$, Ir, IrO$_2$, Pt, PtO, (Ba, Sr) RuO$_3$ (BSRO), CaRuO$_3$ (CRO), (La,Sr) CoO$_3$ (LSCO), or a combination thereof.

Unlike the present disclosure, when an undoped Al$_2$O$_3$ film is arranged between the top electrode 400 and the dielectric film 200, although leakage current may be reduced, the capacitance of the capacitor may be reduced. The doped Al$_2$O$_3$ film 300 of the present disclosure may limit and/or minimize a reduction in capacitance while having a leakage current blocking property that is similar to that of an undoped Al$_2$O$_3$ film.

Unlike the present disclosure, when an undoped Al$_2$O$_3$ film or a doped Al$_2$O$_3$ film is arranged between the dielectric film 200 and the bottom electrode 100, crystallinity of the dielectric film 200 may be reduced due to deterioration in induction, performed by the bottom electrode 100, of the crystallinity of the dielectric film 200. Accordingly, the capacitance of the capacitor may be reduced. The doped Al$_2$O$_3$ film 300 of the present disclosure may be arranged between the dielectric film 200 and the top electrode 400 and thus may not reduce the crystallinity of the dielectric film 200. Accordingly, the capacitance of the capacitor may not be reduced.

Figure 2:
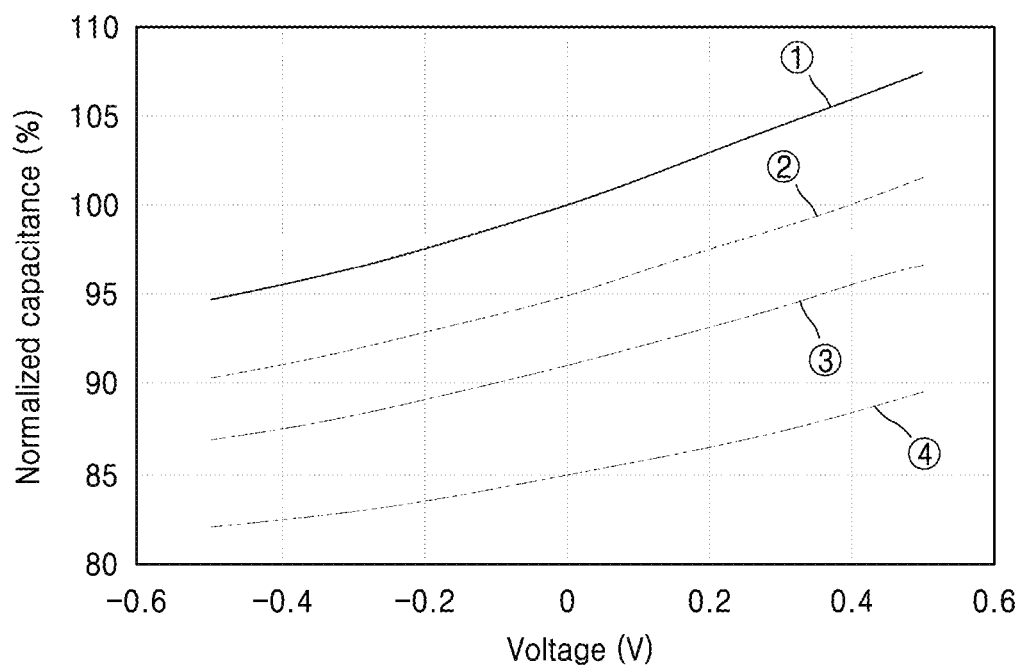
FIG. 2 illustrates normalized capacitance change graphs.
Figure 3:
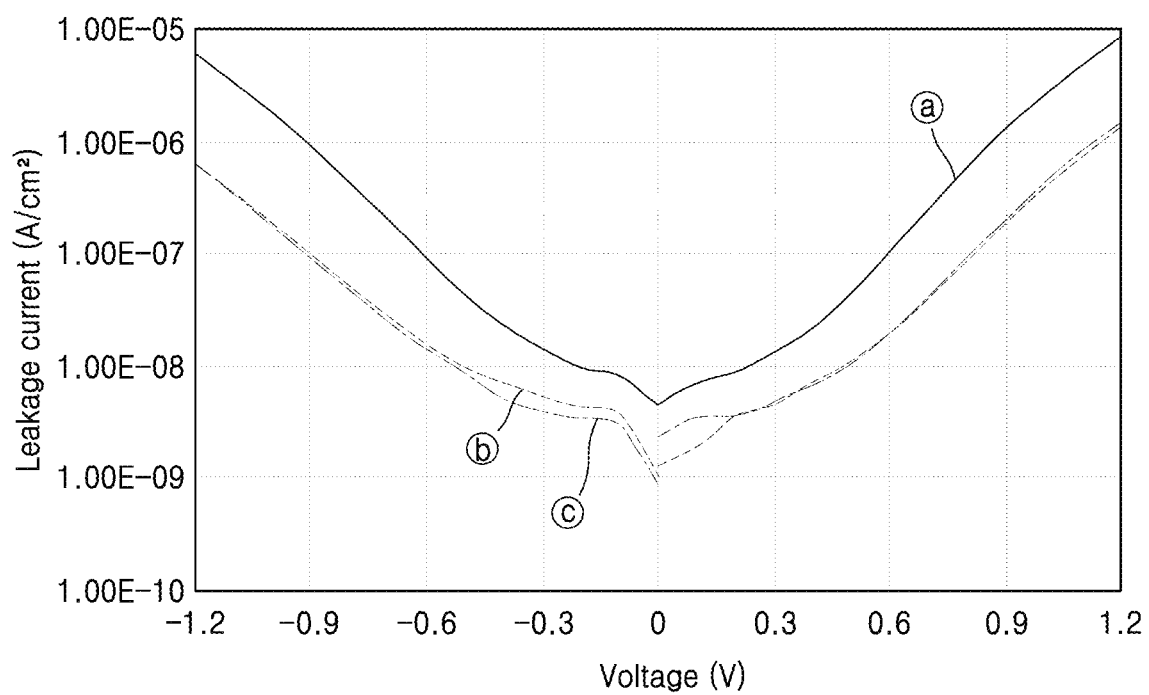
FIG. 3 illustrates leakage current change graphs.

FIG. 2 illustrates normalized capacitance change graphs. FIG. 3 illustrates leakage current change graphs.

Referring to FIG. 2, a normalized capacitance change graph ① in the case where the doped Al$_2$O$_3$ film 300 was removed from the capacitor 1 of FIG. 1, a normalized capacitance change graph ②  of the capacitor 1 of FIG. 1, a normalized capacitance change graph ③ in the case where an undoped $Al_2O_3$ film, instead of the doped $Al_2O_3$ film 300, was applied to the capacitor 1 of FIG. 1, and a normalized capacitance change graph ④ in the case where, in the capacitor 1 of FIG. 1, the doped $Al_2O_3$ film 300 was arranged between the bottom electrode 100 and the dielectric film 200 rather than between the top electrode 400 and the dielectric film 200 are provided.

As compared with the case where the doped $Al_2O_3$ film 300 was removed from the capacitor 1 of FIG. 1 (graph ①), there was a greatest reduction in capacitance in the case where, in the capacitor 1 of FIG. 1, the doped $Al_2O_3$ film 300 was arranged between the bottom electrode 100 and the dielectric film 200 rather than between the top electrode 400 and the dielectric film 200 (graph ④).

In the case where an undoped $Al_2O_3$ film, instead of the doped $Al_2O_3$ film 300, was applied to the capacitor 1 of FIG. 1 (graph ③), the reduction in capacitance was smaller than in the case where, in the capacitor 1 of FIG. 1, the doped $Al_2O_3$ film 300 was arranged between the bottom electrode 100 and the dielectric film 200 rather than between the top electrode 400 and the dielectric film 200 (graph ④).

In the case of the capacitor 1 of FIG. 1 (graph ②), the reduction in capacitance was smallest.

Referring to FIG. 3, a leakage current change graph ⓐ in the case where the doped $Al_2O_3$ film 300 was removed from the capacitor 1 of FIG. 1, a leakage current change graph ⓑ of the capacitor 1 of FIG. 1, and a leakage current change graph ⓒ in the case where an undoped $Al_2O_3$ film, instead of the doped $Al_2O_3$ film 300, was applied to the capacitor 1 of FIG. 1 are provided.

As compared with the case where the doped $Al_2O_3$ film 300 was removed from the capacitor 1 of FIG. 1 (graph ⓐ), the reduction in leakage current in the case of the capacitor 1 of FIG. 1 (graph ⓑ) was similar to the reduction in leakage current in the case where an undoped $Al_2O_3$ film, instead of the doped $Al_2O_3$ film 300, was applied to the capacitor 1 of FIG. (graph ⓒ).

The doped $Al_2O_3$ film 300 of the present disclosure may limit and/or minimize the reduction in capacitance of the capacitor 1 while having a leakage current reducing property similar to that of an undoped $Al_2O_3$ film.

Figure 4:
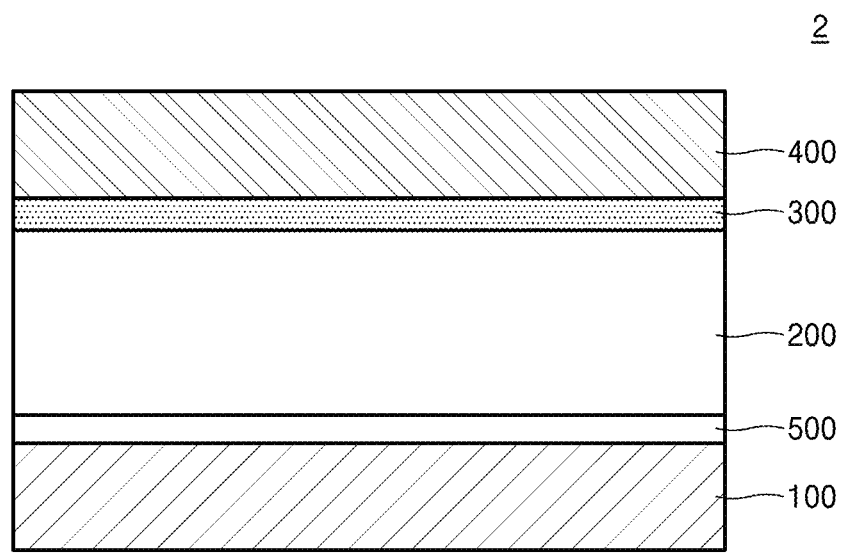
FIG. 4 is a cross-sectional view of a capacitor according to an example embodiment.

FIG. 4 is a cross-sectional view of a capacitor according to an example embodiment. For simplicity of descriptions, substantially the same descriptions as those given with reference to FIG. 1 may be omitted.

Referring to FIG. 4, a capacitor 2 may be provided. The capacitor 2 may include a bottom electrode 100, an interfacial film 500, a dielectric film 200, a doped $Al_2O_3$ film 300, and a top electrode 400. The bottom electrode 100, the dielectric film 200, the doped $Al_2O_3$ film 300, and the top electrode 400 may be respectively and substantially the same as the bottom electrode 100, the dielectric film 200, the doped $Al_2O_3$ film 300, and the top electrode 400, which have been described with reference to FIG. 1.

The interfacial film 500 may be arranged between the bottom electrode 100 and the dielectric film 200. The interfacial film 500 may include a metal oxide including a metal element that is included in the bottom electrode 100. When the bottom electrode 100 includes a metal nitride represented by MM'N, the interfacial film 500 may include a metal oxynitride represented by MM'ON. Here, M is a metal element included in the bottom electrode 100, M' is an element included in the bottom electrode 100 and different from M, N is nitrogen, and O is oxygen. Example materials of M and M' may be substantially the same as those described with reference with FIG. 1. The thickness of the interfacial film 500 may be less than the thickness of the bottom electrode 100. The interfacial film 500 may include carbon impurities in an amount of 1% or less.

Figure 5:
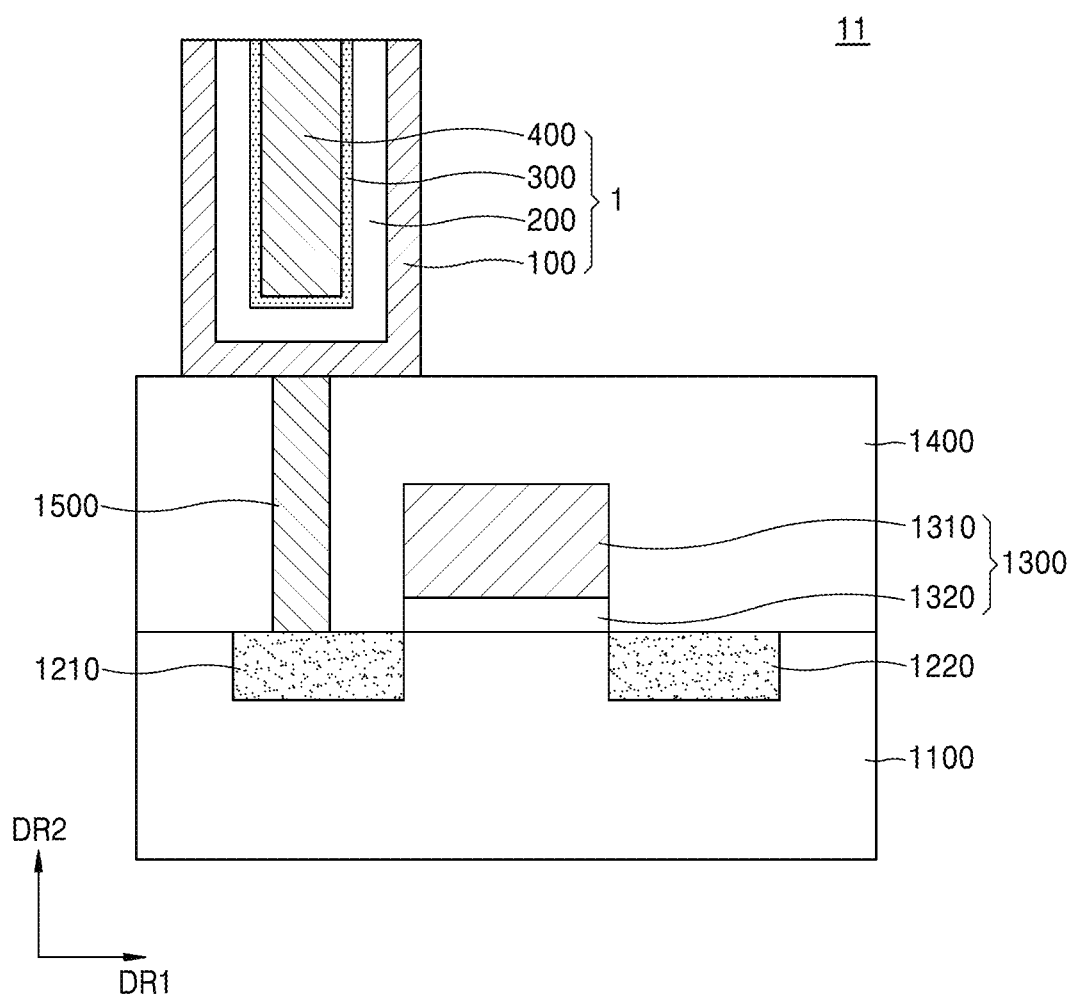
FIG. 5 is a cross-sectional view of a semiconductor device according to an example embodiment.

FIG. 5 is a cross-sectional view of a semiconductor device according to an example embodiment. For simplicity of descriptions, substantially the same descriptions as those given with reference to FIG. 1 may be omitted.

Referring to FIG. 5, a semiconductor device 11 including a substrate 1100, a gate structure 1300, an interlayer dielectric 1400, a contact 1500, and a capacitor 1 may be provided. The substrate 1100 may include a semiconductor substrate. For example, the substrate 1100 may include a silicon substrate, a germanium substrate, or a silicon-germanium substrate.

A first source/drain region 1210 and a second source/drain region 1220 may be arranged in upper portions of the substrate 1100. The first and second source/drain regions 1210 and 1220 may be apart from each other in a first direction DR1 that is parallel to a top surface of the substrate 1100. The first and second source/drain regions 1210 and 1220 may be formed by implanting impurities into the substrate 1100.

The gate structure 1300 may be arranged on the substrate 1100. The gate structure 1300 may be arranged between the first and second source/drain regions 1210 and 1220. The gate structure 1300 may include a gate electrode 1310 and a gate insulating film 1320. The gate electrode 1310 may include a conductive material. For example, the gate electrode 1310 may include a metal or polysilicon.

The gate insulating film 1320 may be arranged between the gate electrode 1310 and the substrate 1100. The gate insulating film 1320 may electrically insulate the substrate 1100 from the gate electrode 1310. The gate insulating film 1320 may include a dielectric material. For example, the gate insulating film 1320 may include a Si oxide (for example, $SiO_2$), an Al oxide (for example, $Al_2O_3$), or a high-k material (for example, $HfO_2$).

The interlayer dielectric 1400 may be arranged on the substrate 1100 to cover the gate structure 1300. The interlayer dielectric 1400 may include an insulating material. For example, the interlayer dielectric 1400 may include a Si oxide (for example, $SiO_2$), an Al oxide (for example, $Al_2O_3$), or a high-K material (for example, $HfO_2$).

The capacitor 1 may be arranged on the interlayer dielectric 1400. The capacitor 1 may include a bottom electrode 100, a top electrode 400, a dielectric film 200, and a doped $Al_2O_3$ film 300. The bottom electrode 100, the top electrode 400, the dielectric film 200, and the doped $Al_2O_3$ film 300 may be respectively and substantially the same as the bottom electrode 100, the top electrode 400, the dielectric film 200, and the doped $Al_2O_3$ film 300, which have been described with reference to FIG. 1.

The contact 1500 may be arranged between the bottom electrode 100 and the first source/drain region 1210. The contact 1500 may penetrate the interlayer dielectric 1400. The contact 1500 may electrically connect the bottom electrode 100 to the first source/drain region 1210. The contact 1500 may include a conductive material (for example, a metal).

The doped $Al_2O_3$ film 300 may limit and/or minimize a reduction in capacitance of a capacitor while having a leakage current blocking property similar to that of an undoped $Al_2O_3$ film. The capacitor 1 of the present disclosure may include the doped $Al_2O_3$ film 300 as a leakage current reducing layer. Accordingly, the stability and reliability of the semiconductor device 11 may be improved.

Figure 6:
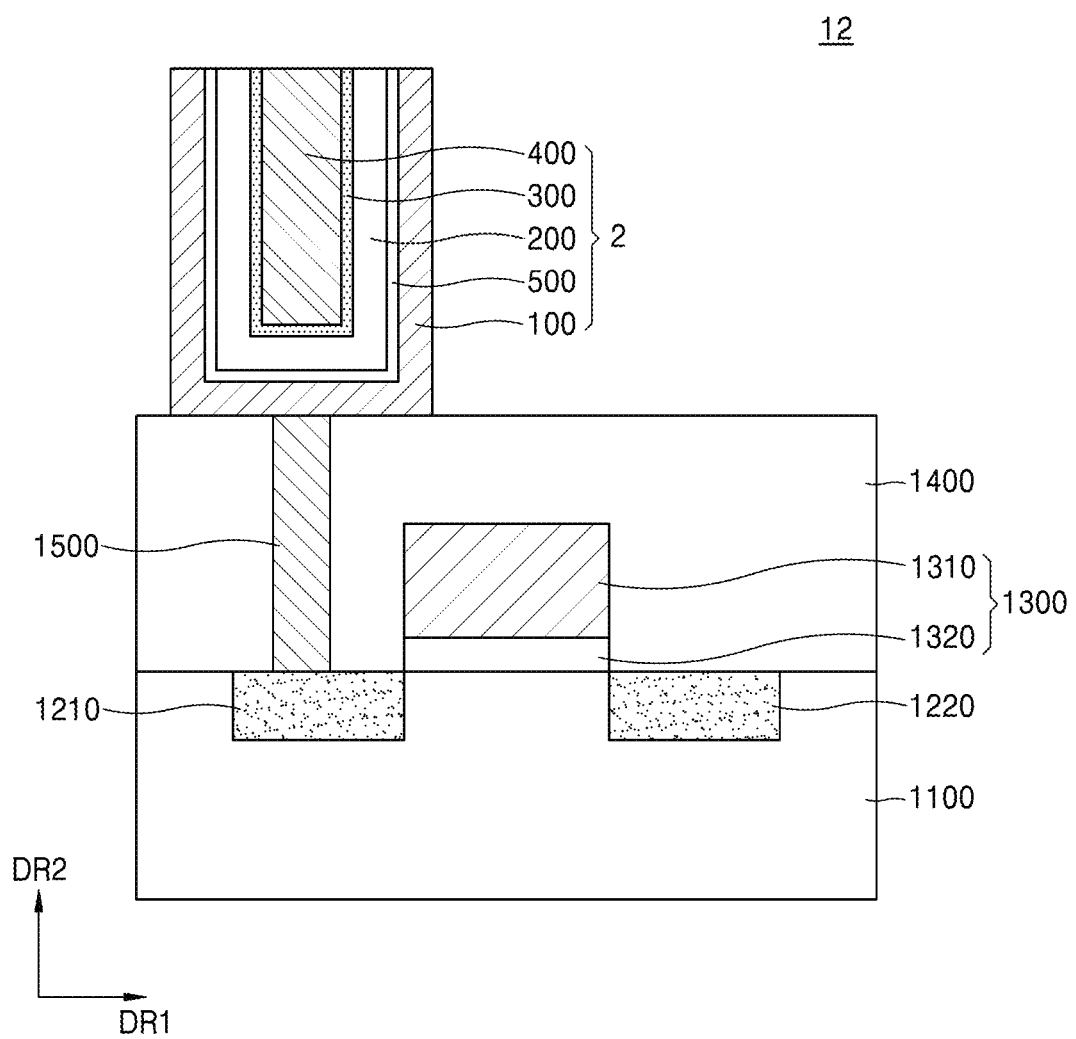
FIG. 6 is a cross-sectional view of a semiconductor device according to an example embodiment.

FIG. 6 is a cross-sectional view of a semiconductor device according to an example embodiment. For simplicity of descriptions, substantially the same descriptions as those given with reference to FIGS. 1, 4, and 5 may be omitted.

Referring to FIG. 6, a semiconductor device 12 including a substrate 1100, a gate structure 1300, an interlayer dielectric 1400, a contact 1500, and a capacitor 2 may be provided. The substrate 1100, the gate structure 1300, the interlayer dielectric 1400, and the contact 1500 may be respectively and substantially the same as the substrate 1100, the gate structure 1300, the interlayer dielectric 1400, and the contact 1500, which have been described with reference to FIG. 5.

The capacitor 2 may be arranged on the interlayer dielectric 1400. The capacitor 2 may include a bottom electrode 100, an interfacial film 500, a top electrode 400, a dielectric film 200, and a doped $Al_2O_3$ film 300. The bottom electrode 100, the top electrode 400, the dielectric film 200, and the doped $Al_2O_3$ film 300 may be respectively and substantially the same as the bottom electrode 100, the top electrode 400, the dielectric film 200, and the doped $Al_2O_3$ film 300, which have been described with reference to FIG. 1. The interfacial film 500 may be substantially the same as the interfacial film 500 described with reference to FIG. 4.

The doped $Al_2O_3$ film 300 may limit and/or minimize a reduction in capacitance of a capacitor while having a leakage current blocking property similar to that of an undoped $Al_2O_3$ film. The capacitor 2 of the present disclosure may include the doped $Al_2O_3$ film 300 as a leakage current reducing layer. Accordingly, the stability and reliability of the semiconductor device 12 may be improved.

Figure 7:
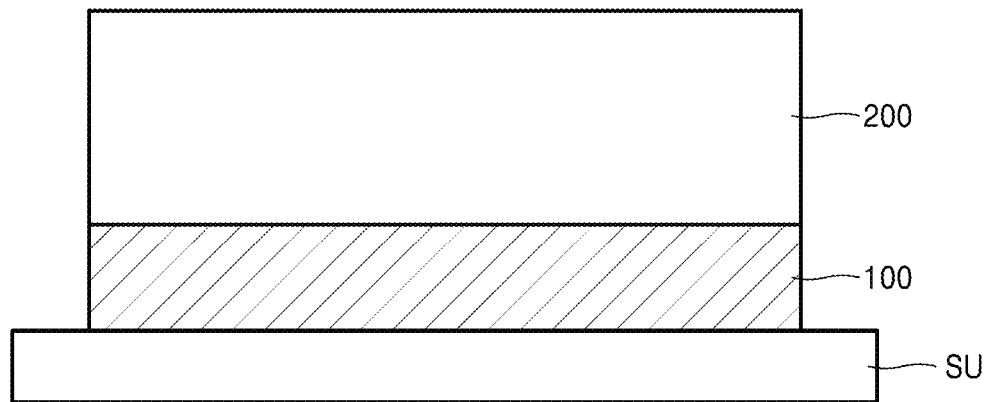
FIG. 7 is a cross-sectional view illustrating a method of fabricating the capacitor of FIG. 1.
Figure 8:
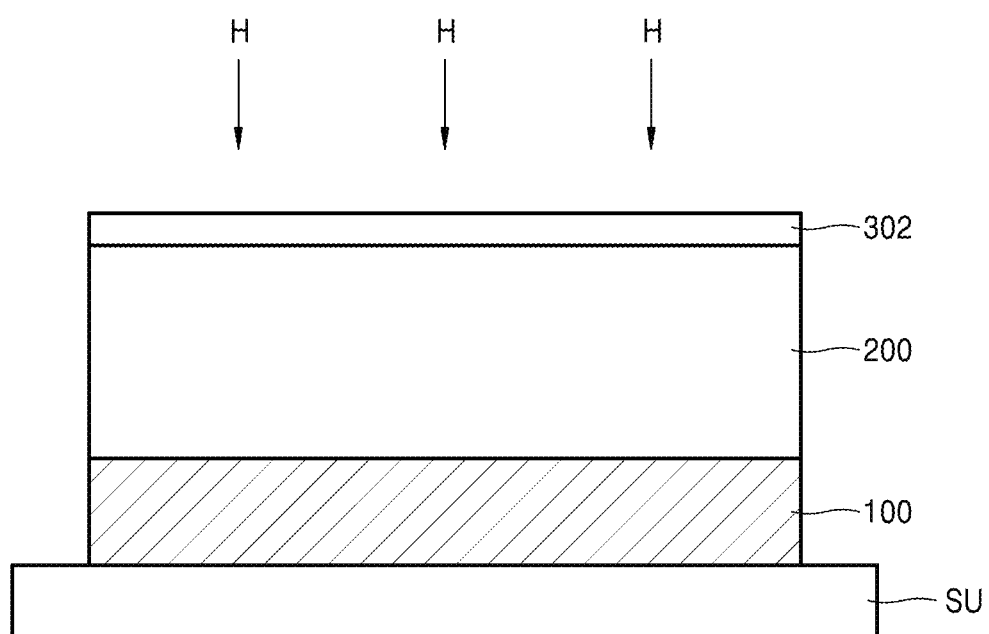
FIG. 8 is a cross-sectional view illustrating a method of fabricating the capacitor of FIG. 1.

FIG. 7 is a cross-sectional view illustrating a method of fabricating the capacitor of FIG. 1. FIG. 8 is a cross-sectional view illustrating a method of fabricating the capacitor of FIG. 1.

Referring to FIG. 7, the bottom electrode 100 and the dielectric film 200 may be sequentially formed on a substrate SU in this stated order. The substrate SU may include a semiconductor material pattern, an insulating material pattern, and a conductive material pattern. For example, the substrate SU may include the substrate 1100, the gate structure 1300, the interlayer dielectric 1400, and the contact 1500 of FIGS. 5 and 6.

The bottom electrode 100 may be formed on the substrate SU by a deposition process. For example, a process of forming the bottom electrode 100 may include a chemical vapor deposition (CVD) process, a physical vapor deposition (PVD) process, or an atomic layer deposition (ALD) process. The bottom electrode 100 may include a metal, a metal nitride, a metal oxide, or a combination thereof. For example, the bottom electrode 100 may include TIN, MON, CON, TaN, W, Ru, $RuO_2$, $SrRuO_3$, Ir, $IrO_2$, Pt, PtO, (Ba, Sr)$RuO_3$ (BSRO), $CaRuO_3$ (CRO), (La,Sr)$CoO_3$ (LSCO), or a combination thereof. A method of manufacturing the bottom electrode 100 when the bottom electrode 100 includes a metal nitride represented by MM'N will be described below in detail.

The dielectric film 200 may be deposited on the bottom electrode 100. For example, the dielectric film 200 may be formed by a CVD process, a PVD process, or an ALD process. The dielectric film 200 may include a high-k material. For example, the dielectric film 200 may include a metal oxide including at least one metal selected from among Ca, Sr, Ba, Sc, Y, La, Ti, Hf, Zr, Nb, Ta, Ce, Pr, Nd, Gd, Dy, Yb, and Lu. For example, the dielectric film 200 may include $HfO_2$, $ZrO_2$, $CeO_2$, $La_2O_3$, $Ta_2O_3$, or $TiO_2$.

Referring to FIG. 8, an undoped $Al_2O_3$ film 302 may be formed on the dielectric film 200. The undoped $Al_2O_3$ film 302 may be formed by a deposition process. For example, the undoped $Al_2O_3$ film 302 may be formed by a CVD process, a PVD process, or an ALD process.

During the process of forming the undoped $Al_2O_3$ film 302, or after the completion of the process of forming the undoped $Al_2O_3$ film 302, a heat treatment process H may be performed. By the heat treatment process H, a metal element in the dielectric film 200 may be diffused into the undoped $Al_2O_3$ film 302. For example, at least one selected from among Ca, Sr, Ba, Sc, Y, La, Ti, Hf, Zr, Nb, Ta, Ce, Pr, Nd, Gd, Dy, Yb, and Lu, in the dielectric film 200, may be diffused into the undoped $Al_2O_3$ film 302. The heat treatment process H allows the undoped $Al_2O_3$ film 302 to be doped with the diffused metal element, thereby forming the doped $Al_2O_3$ film 300 described with reference to FIG. 1. In other words, the doped $Al_2O_3$ film 300 may be doped with the diffused metal element. However, a process of forming the doped $Al_2O_3$ film 300 is not limited to the example set forth above. In another example, elements (aluminum (Al) and oxygen (O)) constituting an $Al_2O_3$ film and an element (for example, hafnium (Hf) and/or zirconium (Zr)) required to be doped into the $Al_2O_3$ film may be deposited in situ by an ALD process, thereby forming the doped $Al_2O_3$ film 300. The doped $Al_2O_3$ film 300 may include one type of dopant (for example, the first dopant described with reference to FIG. 1).

Referring again to FIG. 1, the top electrode 400 may be formed on the doped $Al_2O_3$ film 300. The top electrode 400 may be formed by a deposition process. For example, the top electrode 400 may be formed by a CVD process, a PVD process, or an ALD process. The top electrode 400 may include a metal, a metal nitride, a metal oxide, or a combination thereof. For example, the top electrode 400 may include TIN, MON, CON, TaN, W, Ru, $RuO_2$, $SrRuO_3$, Ir, $IrO_2$, Pt, PtO, (Ba, Sr)$RuO_3$ (BSRO), $CaRuO_3$ (CRO), (La, Sr)$CoO_3$ (LSCO), or a combination thereof.

The present disclosure may provide a method of fabricating the capacitor 1 that includes the doped $Al_2O_3$ film 300 including one type of dopant.

Figure 9:
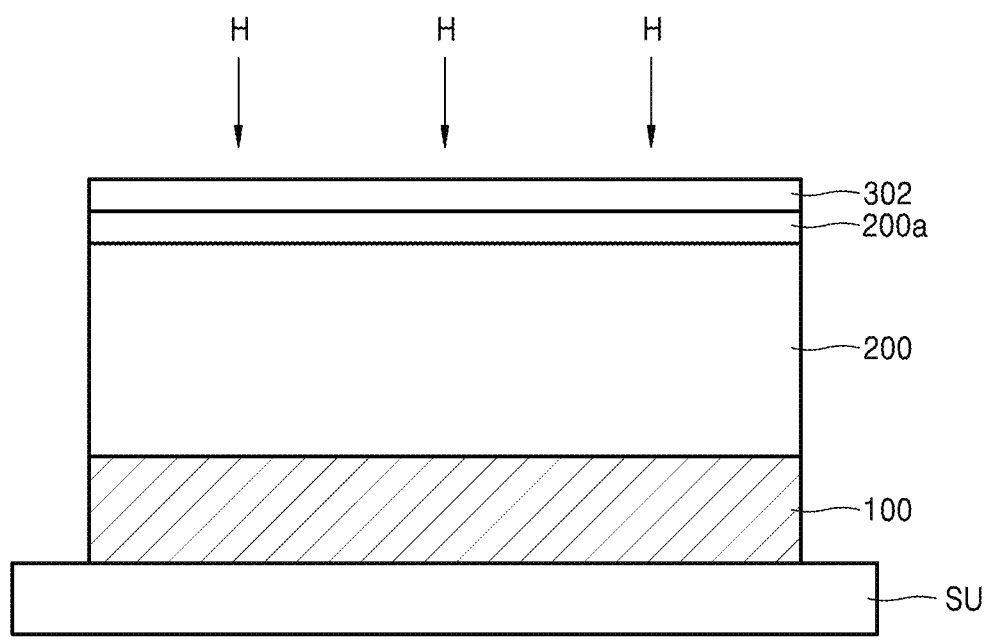
FIG. 9 is a cross-sectional view illustrating a method of fabricating the capacitor of FIG. 1.

FIG. 9 is a cross-sectional view illustrating a method of fabricating the capacitor of FIG. 1. For simplicity of descriptions, substantially the same descriptions as those given with reference to FIGS. 7 and 8 may be omitted.

The bottom electrode 100 and the dielectric film 200 may be formed on the substrate SU by substantially the same process as that described with reference to FIG. 7. Referring to FIG. 9, an additional oxide film 200a may be formed on the dielectric film 200. For example, the additional oxide film 200a may be formed by a CVD process, a PVD process, or an ALD process. The additional oxide film 200a may include a high-k material. For example, the additional oxide film 200a may include a metal oxide including at least one metal, which is selected from among Ca, Sr, Ba, Sc, Y, La, Ti, Hf, Zr, Nb, Ta, Ce, Pr, Nd, Gd, Dy, Yb, and Lu while not included in the dielectric film 200. For example, the additional oxide film 200a may include $HfO_2$, $ZrO_2$, $CeO_2$, $La_2O_3$, $Ta_2O_3$, or $TiO_2$. The dielectric film 200 and additional oxide film 200a may provide a dielectric film structure where dielectric film 200 is a first region and the additional oxide film 200a is a second region.

The undoped $Al_2O_3$ film 302 may be formed on the additional oxide film 200a. The undoped $Al_2O_3$ film 302 may be formed by a deposition process. For example, the undoped $Al_2O_3$ film 302 may be formed by a CVD process, a PVD process, or an ALD process.

During the process of forming the undoped $Al_2O_3$ film 302, or after the completion of the process of forming the undoped $Al_2O_3$ film 302, the heat treatment process H may be performed. By the heat treatment process H, a metal element in the dielectric film 200 and a metal element in the additional oxide film 200a may be diffused into the undoped $Al_2O_3$ film 302. For example, one selected from among Ca, Sr, Ba, Sc, Y, La, Ti, Hf, Zr, Nb, Ta, Ce, Pr, Nd, Gd, Dy, Yb, and Lu, in the dielectric film 200, and one selected from among Ca, Sr, Ba, Sc, Y, La, Ti, Hf, Zr, Nb, Ta, Ce, Pr, Nd, Gd, Dy, Yb, and Lu, in the additional oxide film 200a, may be diffused into the undoped $Al_2O_3$ film 302. The heat treatment process H allows the undoped $Al_2O_3$ film 302 to be doped with the diffused metal elements, thereby forming the doped $Al_2O_3$ film 300 described with reference to FIG. 1. However, the process of forming the doped $Al_2O_3$ film 300 is not limited to the example set forth above. In another example, elements (aluminum (Al) and oxygen (O)) constituting an $Al_2O_3$ film and an element (for example, hafnium (Hf) and/or zirconium (Zr)) required to be doped into the $Al_2O_3$ film may be deposited in situ by an ALD process, thereby forming the doped $Al_2O_3$ film 300. The doped $Al_2O_3$ film 300 of the present disclosure may include two types of dopants (for example, the first dopant and the second dopant, both described with reference to FIG. 1). However, the doped $Al_2O_3$ film 300 is not limited to including two types of dopants. In another example, the doped $Al_2O_3$ film 300 may include three or more types of dopants.

Referring again to FIG. 1, the top electrode 400 may be formed on the doped $Al_2O_3$ film 300. The top electrode 400 may be formed by a deposition process. For example, the top electrode 400 may be formed by a CVD process, a PVD process, or an ALD process. The top electrode 400 may include a metal, a metal nitride, a metal oxide, or a combination thereof. For example, the top electrode 400 may include TIN, MON, CON, TaN, W, Ru, $RuO_2$, $SrRuO_3$, Ir, $IrO_2$, Pt, PtO, $(Ba, Sr)RuO_3$ (BSRO), $CaRuO_3$ (CRO), (La, Sr)$CoO_3$ (LSCO), or a combination thereof.

The present disclosure may provide a method of fabricating the capacitor 1 that includes the doped $Al_2O_3$ film 300 including two types of dopants.

Figure 10:
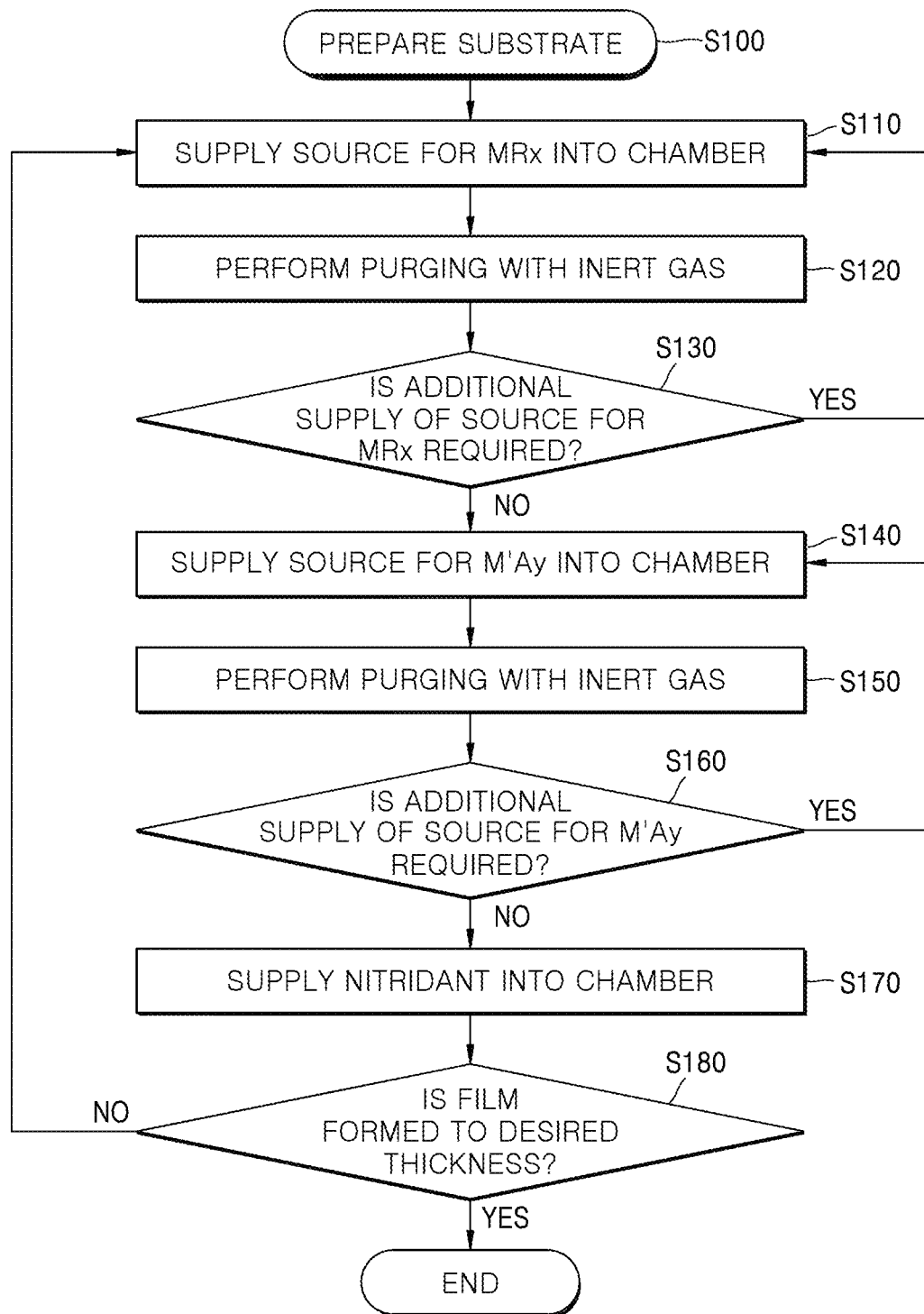
FIG. 10 is a flowchart illustrating a method of manufacturing a bottom electrode that includes a metal nitride represented by MM'N.
Figure 11A:
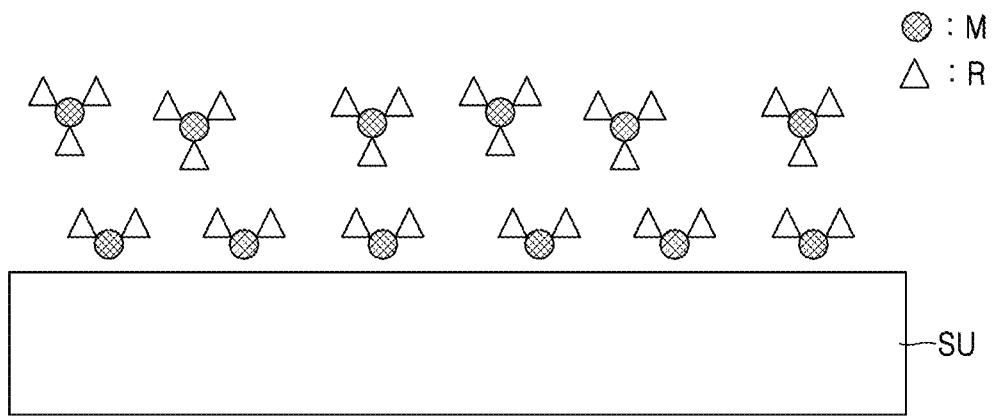
FIG. 11A is a conceptual diagram illustrating the method of manufacturing a bottom electrode according to FIG. 10.
Figure 11B:
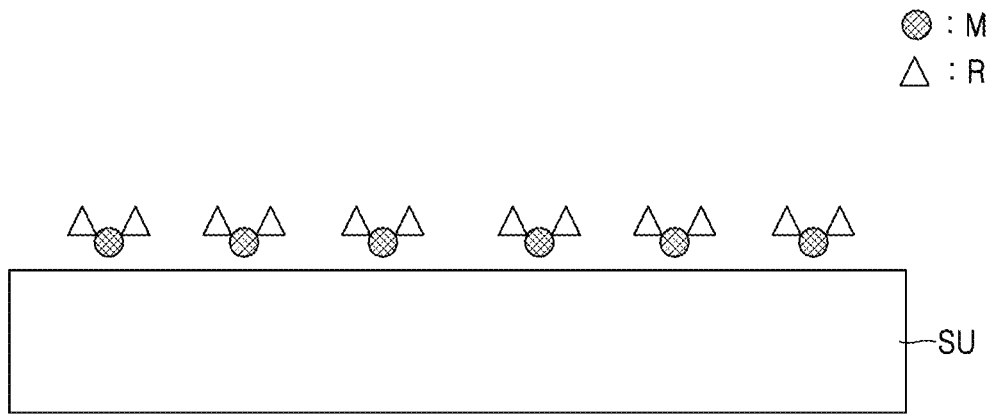
FIG. 11B is a conceptual diagram illustrating the method of manufacturing a bottom electrode according to FIG. 10.
Figure 11C:
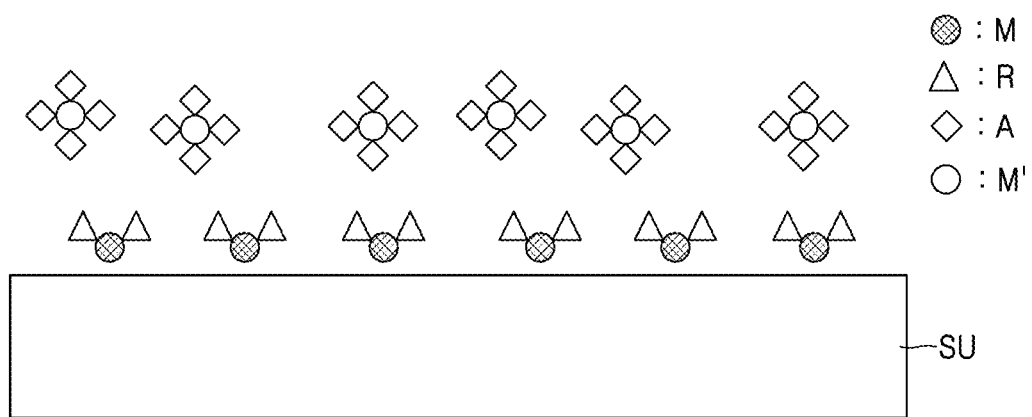
FIG. 11C is a conceptual diagram illustrating the method of manufacturing a bottom electrode according to FIG. 10.
Figure 11D:
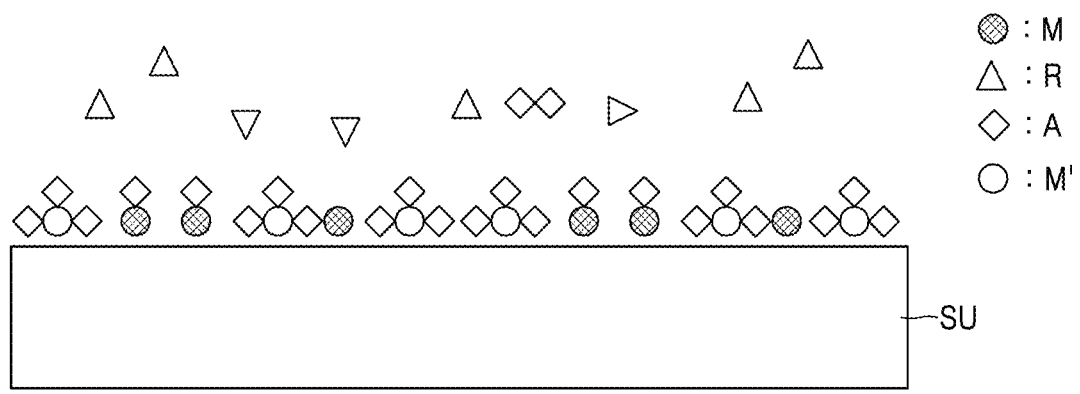
FIG. 11D is a conceptual diagram illustrating the method of manufacturing a bottom electrode according to FIG. 10.
Figure 11E:
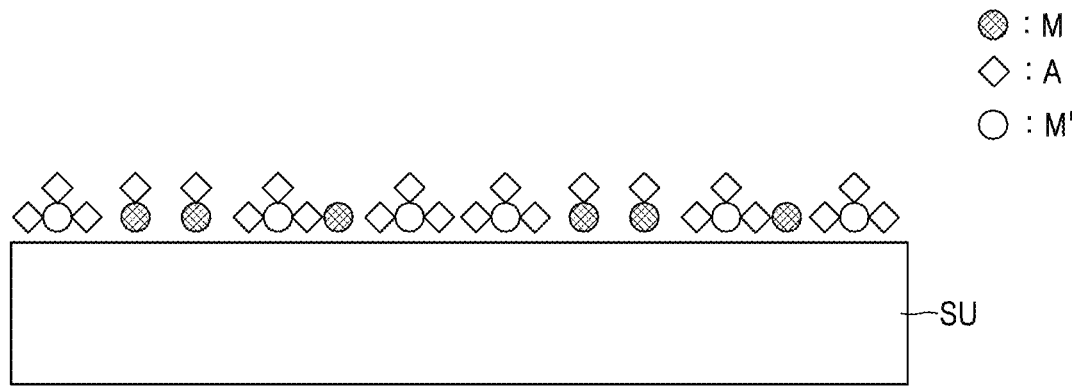
FIG. 11E is a conceptual diagram illustrating the method of manufacturing a bottom electrode according to FIG. 10.
Figure 11F:
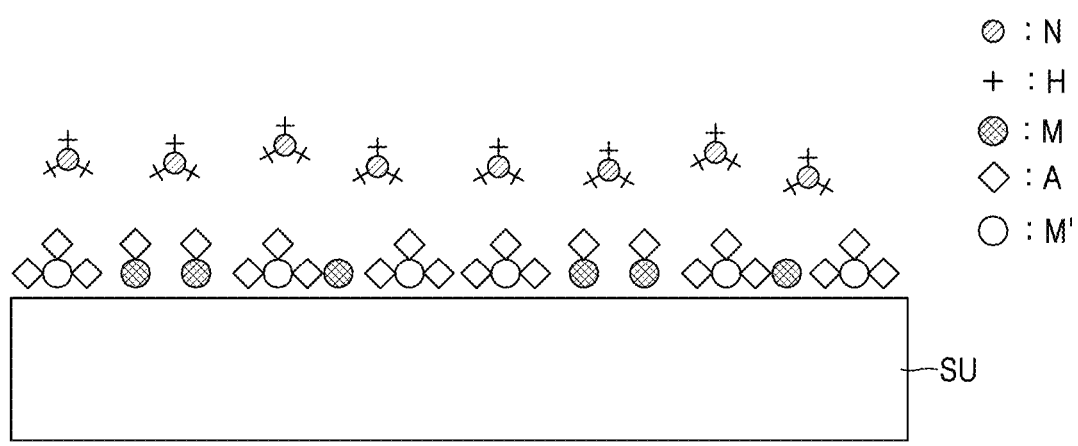
FIG. 11F is a conceptual diagram illustrating the method of manufacturing a bottom electrode according to FIG. 10.
Figure 11G:
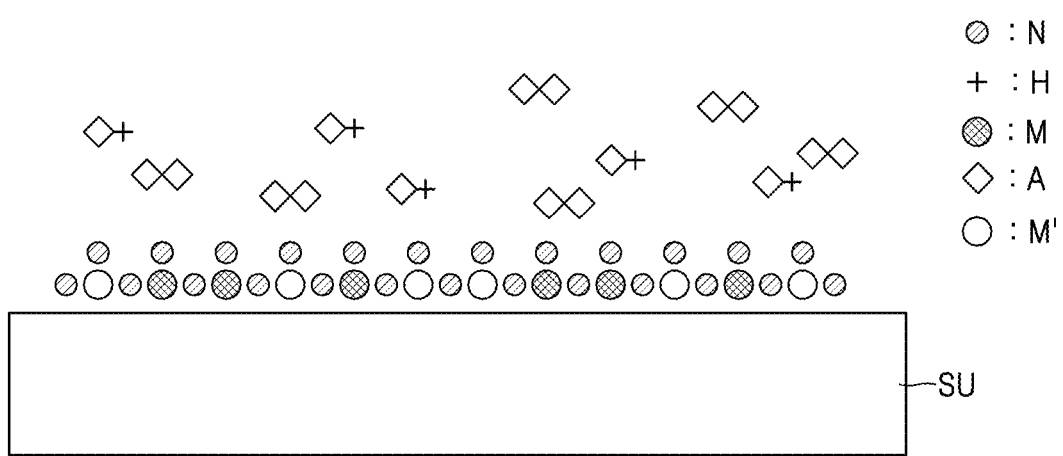
FIG. 11G is a conceptual diagram illustrating the method of manufacturing a bottom electrode according to FIG. 10.
Figure 11H:
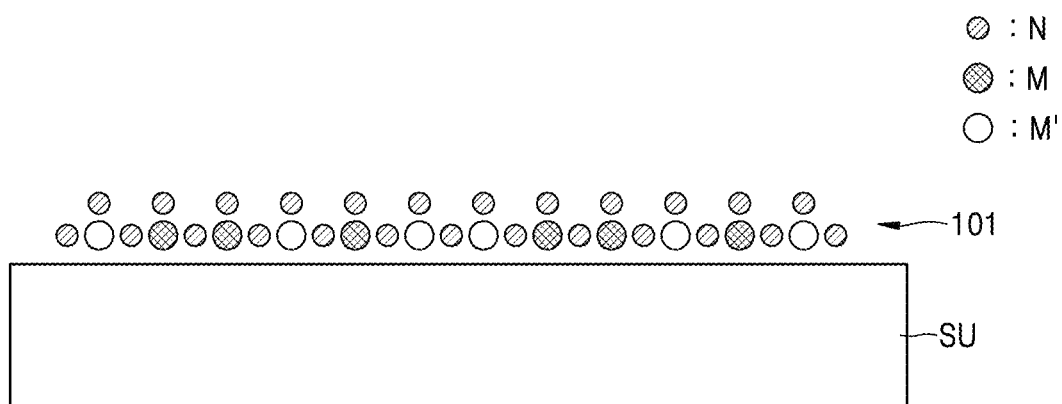
FIG. 11H is a conceptual diagram illustrating the method of manufacturing a bottom electrode according to FIG. 10.

FIG. 10 is a flowchart illustrating a method of manufacturing a bottom electrode that includes a metal nitride represented by MM'N. FIG. 11A is a conceptual diagram illustrating the method of manufacturing a bottom electrode according to FIG. 10. FIG. 11B is a conceptual diagram illustrating the method of manufacturing a bottom electrode according to FIG. 10. FIG. 11C is a conceptual diagram illustrating the method of manufacturing a bottom electrode according to FIG. 10. FIG. 11D is a conceptual diagram illustrating the method of manufacturing a bottom electrode according to FIG. 10. FIG. 11E is a conceptual diagram illustrating the method of manufacturing a bottom electrode according to FIG. 10. FIG. 11F is a conceptual diagram illustrating the method of manufacturing a bottom electrode according to FIG. 10. FIG. 11G is a conceptual diagram illustrating the method of manufacturing a bottom electrode according to FIG. 10. FIG. 11H is a conceptual diagram illustrating the method of manufacturing a bottom electrode according to FIG. 10.

Referring to FIGS. 10, 11A, and 11B, the substrate SU may be prepared (S100). The substrate SU may have a target surface on which a bottom electrode is to be formed. The substrate SU may include a semiconductor material pattern, an insulating material pattern, and a conductive material pattern. For example, the substrate SU may include the substrate 1100, the gate structure 1300, the interlayer dielectric 1400, and the contact 1500 of FIGS. 5 and 6.

The substrate SU may be arranged in a reaction chamber, and then, a first source including a metal organic ligand may be supplied into the reaction chamber (S110). The metal organic ligand may be represented by MRx including a metal element, M, and an organic ligand, R. Here, x may be in a range of $0<x\leq6$. M may be one of Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, TI, Pb, Bi, Po, Fr, Ra, Ac, Th, Pa, and U. R may include at least one of a C1-C10 alkyl group, a C2-C10 alkenyl group, a carbonyl group (C=O), a halide, a C6-C10 aryl group, a C6-C10 cycloalkyl group, a C6-C10 cycloalkenyl group, (C=O)R (where R is hydrogen or a C1-C10 alkyl group), a C1-C10 alkoxy group, a C1-C10 amidinate, a C1-C10 alkylamide, a C1-C10 alkylimide, —N(Q)(Q') (where Q and Q' are each independently a C1-C10 alkyl group or hydrogen), Q(C=O)CN (where Q is hydrogen or a C1-C10 alkyl group), and a C1-C10 β-diketonate.

As a process of supplying the first source, an ALD process may be used. The ALD process may be performed at a temperature of about 100° C. to about 500° C. The process temperature may be set according to the thermal stability of the metal organic ligand. Because a metal organic ligand having low thermal stability may be decomposed at high temperatures, an ALD process for the metal organic ligand having low thermal stability may be performed at a temperature of about 400° C. or less.

The organic ligand, which is not adsorbed onto the substrate SU, in the metal organic ligand supplied into the reaction chamber may be removed by purging (S120). The purging is a process of discharging, out of the reaction chamber, the organic ligand not involved in a reaction, or the organic ligand that is a by-product after involved in the reaction. An inert gas such as Ar, He, Ne, or the like, or $N_2$ gas may be used for the purging.

As shown in FIG. 11B, the metal organic ligand is adsorbed onto the substrate SU.

The processes of FIGS. 11A and 11B may be represented by the following Chemical Equations (1) and (2).

$$xMR_4 \longrightarrow xMR_{4-a} + x*aR \quad (1)$$

$$xMR_{4-a} + x*aR \longrightarrow xMR_{4-a} \quad (2)$$

Chemical Equation (2) indicates that the residual ligand component is removed by the purging.

Next, it may be determined by a control device (not shown) whether additional supply of the source for MRx is required (S130), and operations S110 and S120 may be repeated as needed.

Referring to FIGS. 10, 11C, 11D, and 11E, a second source including a halogen compound may be supplied into the reaction chamber (S140).As a process of supplying the second source, an ALD process may be used. The ALD process may be performed at a temperature of about 100° C. to about 500° C. The process temperature may be set by taking into account the thermal stability of the metal organic ligand adsorbed onto the substrate SU. Because a metal organic ligand having low thermal stability may be decomposed at high temperatures, an ALD process for the halogen compound may be performed at a temperature of about 400° C. or less.

The halogen compound may be represented by M'Ay (where y is a real number greater than 0) including a halogen element, A. A may include at least one of F, Cl, Br, and I. y may be in a range of 0<y≤6. M' may be one of H, Li, Be, B, N, O, Na, Mg, Al, Si, P, S, K, Ca, Sc, Ti, V, Cr, Mn, Fe, Co, Ni, Cu, Zn, Ga, Ge, As, Se, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U.

Next, the organic ligand not reacting with the halogen compound may be removed by purging (S150). An inert gas such as Ar, He, Ne, or the like, or $N_2$ gas may be used for the purging. In this operation, both the halogen compound not involved in a reaction and a reaction by-product may be removed.

Operation S140 of supplying the second source including the halogen compound and operation S150 of performing the purging are illustrated in FIGS. 11C to 11E and may be represented by the following Chemical Equations (3) to (5).

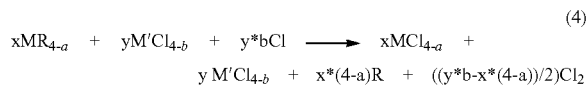

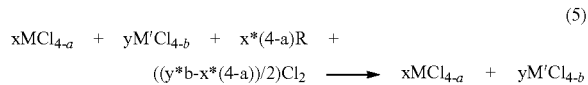

In the above Chemical Equations (3) to (5), Cl is given as an example of the halogen element, A, and Chemical Equation (5) indicates that the residual ligand component and the reaction by-product are removed by the purging.

As shown in FIG. 11E, M supplied from the first source and M' supplied from the second source are adsorbed onto the substrate SU while bonded to the halogen element, A.

Next, it may be determined whether additional supply of the source for M'Ay is required (S160), and operations S140 and S150 may be repeated as needed.

Referring to FIGS. 10, 11F, 11G, and 11H, a nitridant may be supplied into the reaction chamber (S170). An ALD process may be used as a process of supplying the nitridant and may be performed at a temperature of about 100° C. to about 500° C. The nitridant, which is a reaction gas including nitrogen, may include at least one of $NH_3$, $N_2H_2$, $N_3H$, and $N_2H_4$. The nitridant reacts with M bonded to the halogen element, A, and reacts with M' bonded to the halogen element, A, and a metal nitride film, that is, MM'N, is formed on the substrate SU. Most of a reaction by-product including the halogen element is vaporized due to the process temperature.

The supply of the nitridant and the reaction due to the nitridant are illustrated in FIGS. 11F to 11H and may be represented by the following Chemical Equation (6).

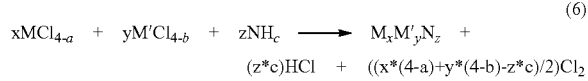

It may be checked whether a metal nitride film 101 is formed to a desired thickness, and operations S110 to S170 may be repeated as needed (S180). The metal nitride film 101 may be the bottom electrode 100 described above.

In an example, after operation S170 of supplying the nitridant into the reaction chamber, a heat treatment may be additionally performed to remove the halogen element of the halogen compound, the halogen element remaining as a reaction by-product. A temperature of the heat treatment may range from about 200° C. to about 1000° C.

In the metal nitride film 101 formed according to the above-described operations, the amount of impurities except for MM'N is extremely low. Because almost all of the organic ligands included in the source used for the formation of MM'N are removed, there are almost no carbon impurities in the metal nitride film 101. This is as shown in the processes according to Chemical Equations (1) to (6). The carbon impurities may be present in an amount of about 1% or less in the metal nitride film 101 formed according to those processes. On the other hand, according to existing methods, ligands or reaction by-products have no choice but to remain. A metal nitride film has higher resistivity with an increasing amount of impurities and thus is not suitable to function as an electrode. The value of resistivity of the metal nitride film may vary by up to a factor of several hundreds depending upon the amount of impurities. The metal nitride film, MM'N, which is manufactured by the method according to an embodiment and thus includes almost no impurities, may have a low value of resistivity and may be used as an excellent electrode material. In an example, the metal nitride film 101 may be the bottom electrode 100 shown in FIGS. 1, 4, 5, 6, 7, 8, and 9.

The method of manufacturing a bottom electrode including a metal nitride, according to the present disclosure, does not include directly reacting a metal organic ligand with a nitridant, and thus, the bottom electrode including the metal nitride having better quality may be formed.

Figure 12:
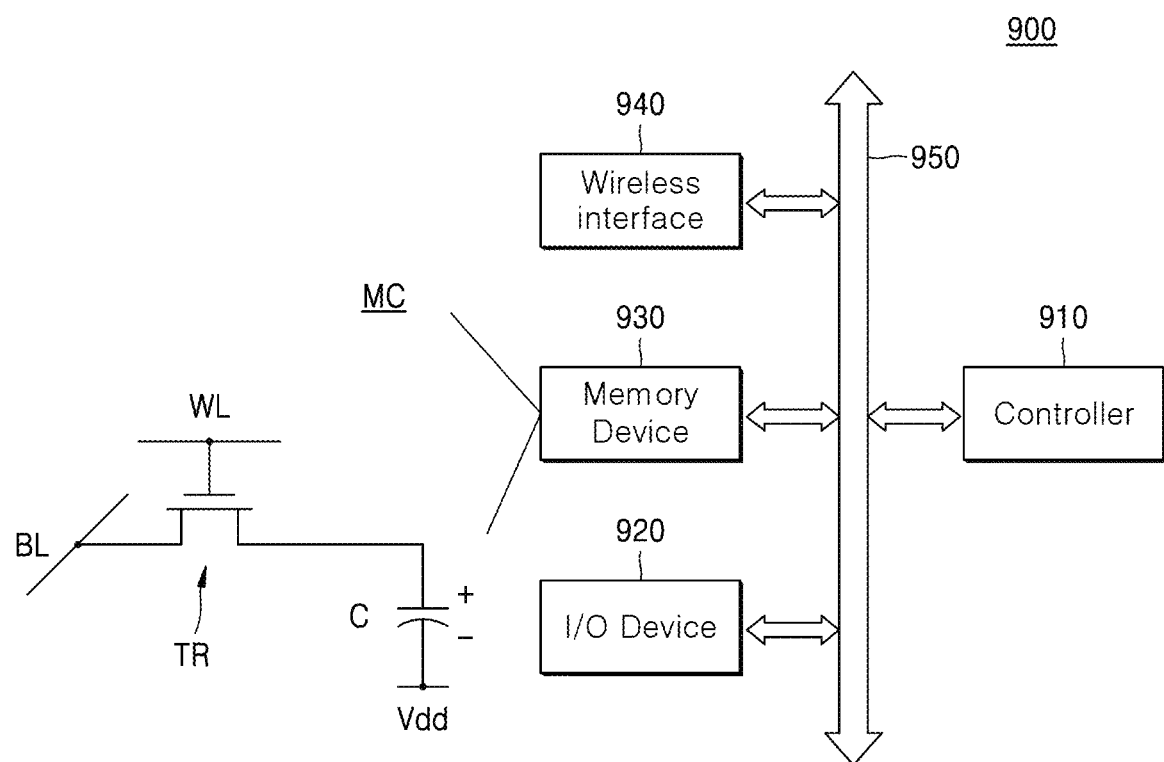
FIG. 12 is a schematic diagram for an electronic device including a capacitor according to some embodiments.

FIG. 12 is a schematic diagram for an electronic device including a capacitor according to some embodiments.

Referring to FIG. 12, an electronic device 900 according to example embodiments of inventive concepts may be a personal digital assistant (PDA), a laptop computer, a portable computer, a web tablet, a wireless phone, a mobile phone, a digital music player, a cable/wireless electronic device, etc., but is not limited thereto. The electronic device 900 may include a controller 910, an input/output (I/O) device 920 (e.g., a keypad, a keyboard and/or a display), a memory device 930, and a wireless interface unit 940 which are combined with each other through a data bus 950. The controller 910 may be implemented with processing circuitry processing circuitry such as hardware including logic circuits; a hardware/software combination such as a processor executing software; or a combination thereof. For example, the processing circuitry more specifically may include, but is not limited to, a central processing unit (CPU), a microprocessor, a digital signal processor, a microcontroller or other logic devices. The other logic devices may have a similar function to any one of the microprocessor, the digital signal processor and the microcontroller. The memory device 930 may store, for example, commands performed by the controller 910. Additionally, the memory device 930 may also be used for storing a user data.

The memory device 930 includes a plurality of memory cells MC. Each of the memory cells MC may include a capacitor C connected to a transistor TR. A word line WL may be connected to a gate of the transistor TR. A bit line BL may be connected one source/drain region of the transistor TR and the capacitor C may be connected to the other source/drain region of the transistor TR. The other end of the capacitor C may be connected to a power supply voltage Vdd. The capacitor C may include the capacitors 1 and/or 2 described in FIGS. 1, 4, 5, and 6 of the present application.

The electronic device 900 may use the wireless interface unit 940 in order to transmit data to a wireless communication network communicating with a radio frequency (RF) signal or in order to receive data from the network. For example, the wireless interface unit 940 may include an antenna or a wireless transceiver. The electronic device 900 may be used in a communication interface protocol such as a third generation communication system (e.g., CDMA, GSM, NADC, E-TDMA, WCDAM, and/or CDMA2000).

Figure 13:
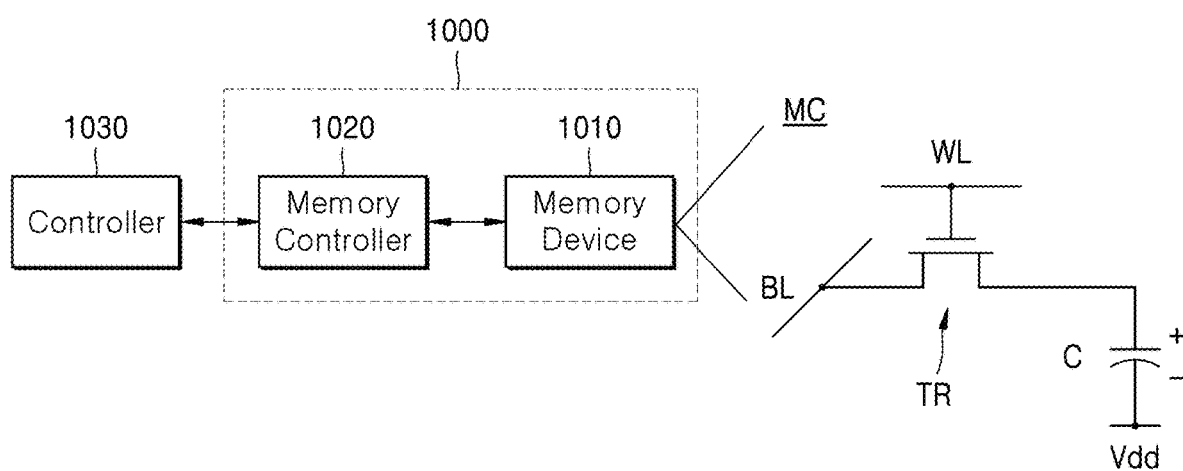
FIG. 13 is a schematic diagram of a memory system including a capacitor according to some embodiments.

FIG. 13 is a schematic diagram of a memory system including a capacitor according to some embodiments.

FIG. 13 is a schematic block diagram illustrating a memory system. Referring to FIG. 13, a memory system 1000 may include a memory device 1010 for storing data and a memory controller 1020. The memory controller 1020 may read or write data from/into the memory device 1010 in response to read/write request of a host 1030. The memory controller 1020 may make an address mapping table for mapping an address provided from the host 1030 (e.g., a mobile device or a computer system) into a physical address of the memory device 1010. The memory controller 1020 may be implemented with processing circuitry processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The memory device 1010 may include a plurality of memory cells MC. Each of the memory cells MC may include a capacitor C connected to a transistor TR, and may have structure that is the same as the memory cell MC described in FIG. 10. The capacitor C may include the capacitors 1 and/or 2 described in FIGS. 1, 4, 5, and 6 of the present application.

The present disclosure may provide a capacitor having improved properties of leakage current and capacitance.

The present disclosure may provide a method of fabricating a capacitor having improved properties of leakage current and capacitance.

The present disclosure may provide a semiconductor device including a capacitor having improved properties of leakage current and capacitance.

However, the present disclosure is not limited to the above-described aspects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A capacitor comprising:
   a bottom electrode;
   a top electrode over the bottom electrode;
   a dielectric film between the bottom electrode and the top electrode; and
   a doped $Al_2O_3$ film between the top electrode and the dielectric film,
   the doped $Al_2O_3$ film including a first dopant and a second dopant that is different from the first dopant, wherein the top electrode directly contacts a top surface of the doped $Al_2O_3$ film.

2. The capacitor of claim 1, wherein the first dopant comprises one of Ca, Sr, Ba, Sc, Y, La, Ti, Hf, Zr, Nb, Ta, Ce, Pr, Nd, Gd, Dy, Yb, and Lu.

3. The capacitor of claim 1, wherein the doped $Al_2O_3$ film comprises the first dopant in an amount greater than 0 at % and less than 50 at %.

4. The capacitor of claim 1, wherein the second dopant comprises one of Ca, Sr, Ba, Sc, Y, La, Nb, Ti, Hf, Zr, Ta, Ce, Pr, Nd, Gd, Dy, Yb, and Lu.

5. The capacitor of claim 1, wherein the first dopant and the second dopant are present in an amount greater than 0 at % and less than 50 at % in total in the doped $Al_2O_3$ film.

6. The capacitor of claim 1, wherein the bottom electrode directly contacts the dielectric film.

7. The capacitor of claim 1, wherein
   the first dopant comprises Hf, and
   the second dopant comprises Zr.

8. The capacitor of claim 1, wherein
   the bottom electrode comprises a metal nitride represented by MM'N,
   M is a metal element,
   M' is an element that is different from M, and
   N is nitrogen.

9. The capacitor of claim 8, wherein the bottom electrode comprises carbon impurities in an amount of greater than 0% and less than or equal to 1%.

10. The capacitor of claim 8, wherein
    M is Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, or U.

11. The capacitor of claim 8, wherein
    M' is H, Li, Be, B, N, O, Na, Mg, Al, Si, P, S, K, Ca, Sc, Ti, V, Cr, Mn, Fe, Co, Ni, Cu, Zn, Ga, Ge, As, Se, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, or U.

12. The capacitor of claim 8, wherein,
    the metal nitride is represented by $M_xM'_yN_z$, $$0 < x \le 2,$$
$$0 < y \le 2, \text{ and}$$
$$0 < z \le 4.$$

13. The capacitor of claim 1, wherein
    the dielectric film has a thickness of greater than 0 nm and less than 5 nm, and
    the doped $Al_2O_3$ film has a thickness of greater than 0 nm and less than 2 nm.

14. The capacitor of claim 1, wherein
    the dielectric film directly contacts a bottom surface of the doped $Al_2O_3$ film.

15. The capacitor of claim 1, wherein the top electrode comprises TiN, MON, CON, TaN, TiAlN, TaAlN, W, Ru, $RuO_2$, $SrRuO_3$, Ir, $IrO_2$, Pt, PtO, (Ba, Sr)$RuO_3$ (BSRO), $CaRuO_3$ (CRO), (La,Sr)$CoO_3$ (LSCO), or a combination thereof.

16. A semiconductor device comprising:
a substrate;
a gate structure on the substrate;
a first source/drain region and a second source/drain region, both arranged in upper portions of the substrate; and
the capacitor of claim 1 on the substrate, wherein
the bottom electrode is electrically connected to the first source/drain region.

17. The semiconductor device of claim 16, wherein the first dopant and the second dopant are selected from different elements among Ca, Sr, Ba, Sc, Y, La, Ti, Hf, Zr, Nb, Ta, Ce, Pr, Nd, Gd, Dy, Yb, and Lu.

18. The semiconductor device of claim 16, wherein the doped $Al_2O_3$ film comprises the first dopant and the second dopant in an amount greater than 0 at % and less than 50 at % in total.

19. The semiconductor device of claim 16, wherein
the top electrode directly contacts a top surface of the doped $Al_2O_3$ film, and the dielectric film directly contacts a bottom surface of the doped $Al_2O_3$ film.

20. The capacitor of claim 1, further comprising:
an interfacial film between the bottom electrode and the dielectric film, wherein
the interfacial film comprises an oxide comprising a metal element that is included in the bottom electrode.

* * * * *